(12) United States Patent
Takagi

(10) Patent No.: US 10,804,376 B2
(45) Date of Patent: Oct. 13, 2020

(54) METHOD OF MANUFACTURING SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Shigeaki Takagi, Himeji Hyogo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/550,676

(22) Filed: Aug. 26, 2019

(65) Prior Publication Data

US 2020/0273968 A1 Aug. 27, 2020

(30) Foreign Application Priority Data

Feb. 27, 2019 (JP) .................................. 2019-033709

(51) Int. Cl.
*H01L 21/336* (2006.01)
*H01L 29/66* (2006.01)
*H01L 21/308* (2006.01)
*H01L 21/3065* (2006.01)
*H01L 29/06* (2006.01)
(Continued)

(52) U.S. Cl.
CPC .. *H01L 29/66712* (2013.01); *H01L 21/02381* (2013.01); *H01L 21/02532* (2013.01); *H01L 21/308* (2013.01); *H01L 21/3065* (2013.01); *H01L 21/30625* (2013.01); *H01L 29/0634* (2013.01)

(58) Field of Classification Search
None
See application file for complete search history.

(56) References Cited

U.S. PATENT DOCUMENTS 8,097,501 B2 * 1/2012 Sakuma .............. H01L 29/7802
438/198
2007/0148931 A1 6/2007 Tokano et al.
(Continued)

FOREIGN PATENT DOCUMENTS

JP 2006-281384 A 10/2006
JP 2007-173734 A 7/2007
JP 2010-182881 A 8/2010
(Continued)

*Primary Examiner* — Jack S Chen
(74) *Attorney, Agent, or Firm* — White & Case LLP

(57) ABSTRACT

A method of manufacturing a semiconductor device includes preparing a first wafer including a first trench; forming a first semiconductor layer inside the first trench so that a first space remains in the first trench; obtaining a first level corresponding to a bottom of the first space and a second level estimated by a size or a shape of the first space; preparing a second wafer including a second trench having a shape and a size substantially same as a shape and a size of the first trench; forming a second semiconductor layer inside the second trench in the second so that a second space remains in the second trench; forming a third semiconductor layer to fill the second space in the second trench; and removing a surface portion of the second wafer to a depth corresponding to a level between the first level and the second level.

13 Claims, 7 Drawing Sheets

(51) Int. Cl.
*H01L 21/02* (2006.01)
*H01L 21/306* (2006.01)

(56) References Cited

U.S. PATENT DOCUMENTS

2010/0197088 A1    8/2010   Sakuma et al.
2013/0164913 A1    6/2013   Eguchi et al.

FOREIGN PATENT DOCUMENTS

JP      2012-156225 A    8/2012
JP      2013-153120 A    8/2013

\* cited by examiner

US 10,804,376 B2

METHOD OF MANUFACTURING SEMICONDUCTOR DEVICE

CROSS-REFERENCE TO RELATED APPLICATIONS

This application is based upon and claims the benefit of priority from Japanese Patent Application No. 2019-033709, filed on Feb. 27, 2019; the entire contents of which are incorporated herein by reference.

FIELD

Embodiments relate to a method of manufacturing a semiconductor device.

BACKGROUND

Power control semiconductor devices include a device having a so-called super junction structure in which an n-type semiconductor layer and a p-type semiconductor layer are arranged alternately in a direction crossing the current. For example, the super junction structure is formed by filling p-type semiconductor layers into trenches provided in an n-type semiconductor. However, when a trench has a large ratio of the depth to the opening width, it becomes difficult to fill a p-type semiconductor layer into the trench without a defect such as void generated therein.

DETAILED DESCRIPTION

Figure 1:
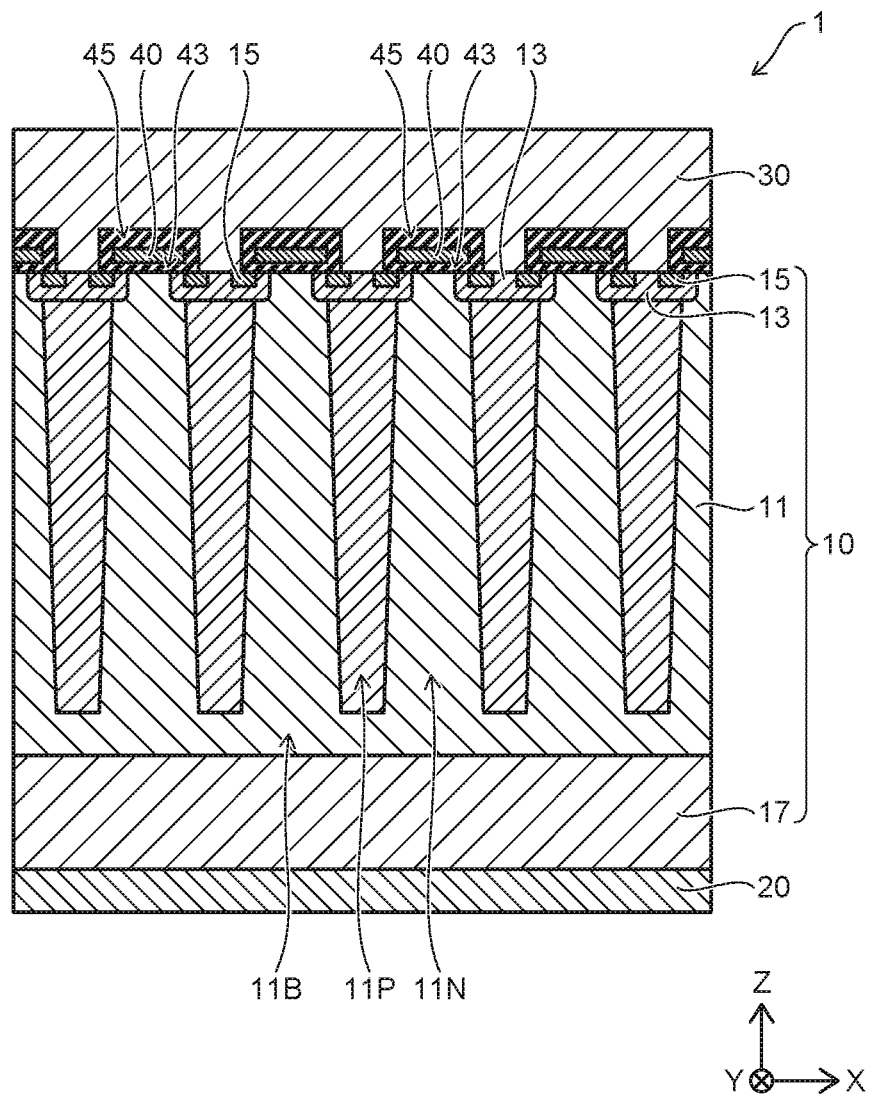
FIG. 1 is a schematic cross-sectional view showing a semiconductor device 1 according to an embodiment.

According to one embodiment, a method of manufacturing a semiconductor device includes preparing a first wafer of a first conductivity type, the first wafer including a first trench having a first opening portion, the first opening portion being enlarged comparing to other portion of the first trench; forming a first semiconductor layer of a second conductivity type inside the first trench of the first wafer under a first growth condition so that a first space remains in the first opening portion of the first trench; obtaining first and second levels along a depth direction of the first trench, the first level corresponding to a bottom of the first space, the second level being estimated by a size or a shape of the first space in the first trench; preparing a second wafer of the first conductivity type, the second wafer including a second trench having a second opening portion, the second opening portion being enlarged comparing to other portion of the second trench, the second trench having a shape and a size substantially same as a shape and a size of the first trench; forming a second semiconductor layer of the second conductivity type inside the second trench in the second wafer under the first growth condition so that a second space remains in the second opening portion of the second trench; forming a third semiconductor layer under a second growth condition to fill the second space in the second trench; and removing a surface portion of the second wafer to a depth corresponding to an intermediate level between the first level and the second level, the surface layer including a portion of the third semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. For example, the semiconductor device 1 is a power MOSFET which has a super junction structure.

As shown in FIG. 1, the semiconductor device 1 includes a semiconductor body 10, a drain electrode 20, a source electrode 30, and a gate electrode 40. The drain electrode 20 is provided on the back surface of the semiconductor body 10. The source electrode 30 is provided on the front surface of the semiconductor body 10. For example, the gate electrode 40 is provided between the semiconductor body 10 and the source electrode 30. For example, the gate electrode 40 opposes the semiconductor body 10 with a gate insulating film 43 interposed. The gate electrode 40 is electrically insulated from the source electrode 30 by an inter-layer insulating film 45.

The semiconductor body 10 includes, for example, a drift layer 11, a p-type diffusion layer 13, an n-type source layer 15, and an n-type drain layer 17. The semiconductor body 10 is, for example, silicon.

The drift layer 11 includes, for example, an n-type pillar 11N, a p-type pillar 11p, and an n-type semiconductor region 11B. For example, the n-type pillar 11N and the p-type pillar lip extend in a direction (the Z-direction) from the drain electrode 20 toward the source electrode 30 and are arranged alternately in a direction (the X-direction) along the front surface of the semiconductor body 10. The n-type pillar 11N is positioned between adjacent p-type pillars 11P. The n-type pillar 11N and the p-type pillar 11P are provided to have a charge balance. In other words, the total amount of the p-type impurities included in the n-type pillar 11N and the p-type pillar 11P is substantially the same as the total amount of the n-type impurities included in the n-type pillar 11N and the p-type pillar 11P.

The n-type semiconductor region 11B is positioned between the p-type pillar 11P and the n-type drain layer 17 and between the n-type pillar 11N and the n-type drain layer 17. The n-type semiconductor region 11B includes the n-type impurities with substantially the same concentration as the n-type impurities in the n-type pillar 11N. For example, the boundary between the n-type semiconductor region 11B and the n-type pillar 11N is positioned at the same level as the boundary between the p-type pillar 11P and the n-type semiconductor region 11B, in the Z-direction.

For example, the p-type diffusion layer 13 is selectively provided between the p-type pillar 11P and the source electrode 30. The p-type diffusion layer 13 includes the p-type impurities with a higher concentration than the concentration of the p-type impurities in the p-type pillar 11P. The source electrode 30 is electrically connected to the p-type diffusion layer 13.

The n-type source layer 15 is selectively provided between the p-type diffusion layer 13 and the source electrode 30. The n-type source layer 15 includes the n-type impurities with a higher concentration than the concentration of the n-type impurities in the n-type pillar 11N. The source electrode 30 contacts the n-type source layer 15 and is electrically connected to the n-type source layer 15.

For example, the gate electrode 40 is provided between the n-type pillar 11N and the source electrode 30. The gate electrode 40 is provided to oppose the n-type pillar 11N and a portion of the p-type diffusion layer 13 between the n-type pillar 11N and the n-type source layer 15 with the gate insulating film 43 interposed.

The n-type drain layer 17 is provided between the drift layer 11 and the drain electrode 20. The n-type drain layer 17 includes the n-type impurities with a higher concentration than the concentration of the n-type impurities in the n-type pillar 11N and the concentration of the n-type impurities in the n-type semiconductor region 11B. For example, the drain electrode 20 contacts the n-type drain layer 17 and is electrically connected to the n-type drain layer 17.

A method of manufacturing the semiconductor device 1 will be described here with reference to FIGS. 2A to 6B.

FIGS. 2A to 6B are schematic cross-sectional views showing manufacturing processes of the semiconductor device 1 according to the embodiment. FIGS. 2A to 6B are schematic views illustrating a cross section of a semiconductor wafer 100. The semiconductor wafer 100 is, for example, an n-type silicon wafer.

Figure 2A:
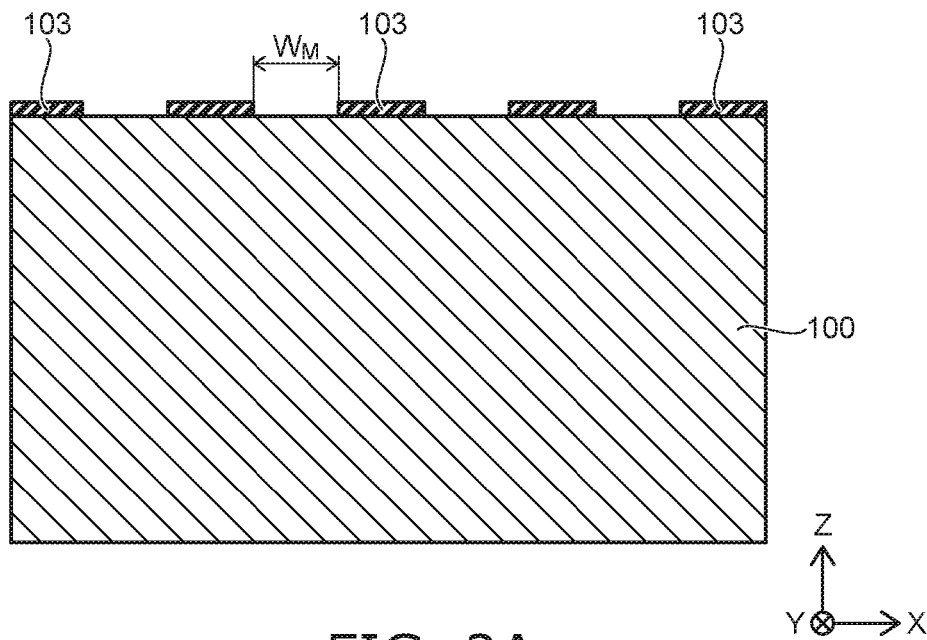
FIGS. 2A to 6B are schematic cross-sectional views showing manufacturing processes of the semiconductor device according to the embodiment.

As shown in FIG. 2A, a mask 103 is formed selectively on the front surface of the semiconductor wafer 100. The mask 103 is, for example, a silicon oxide film. For example, the mask 103 is provided in a line-and-space configuration extending in the Y-direction.

Figure 2B:
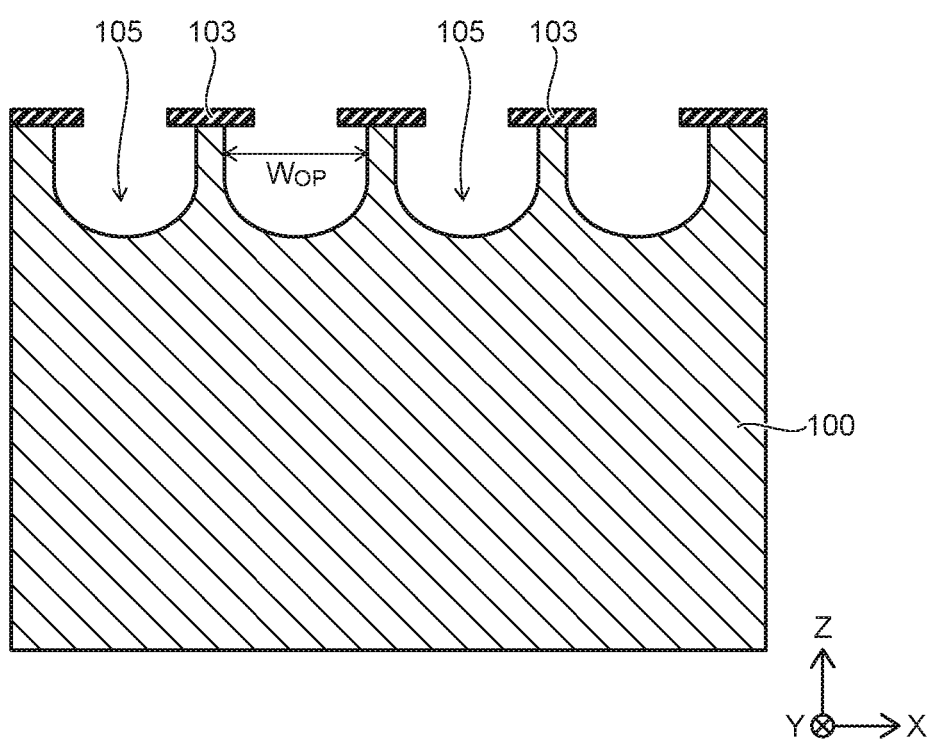

As shown in FIG. 2B, opening portions 105 are formed in the front surface side of the semiconductor wafer 100 by selectively etching the semiconductor wafer 100 using the mask 103. At this time, for example, the semiconductor wafer 100 is isotropically etched using CDE (Chemical Dry Etching) or wet etching. For example, an opening portion 105 is provided to have an opening width $W_{OP}$ in the X-direction that is wider than an opening width $W_M$ of the mask 103 in the X-direction.

Figure 3A:
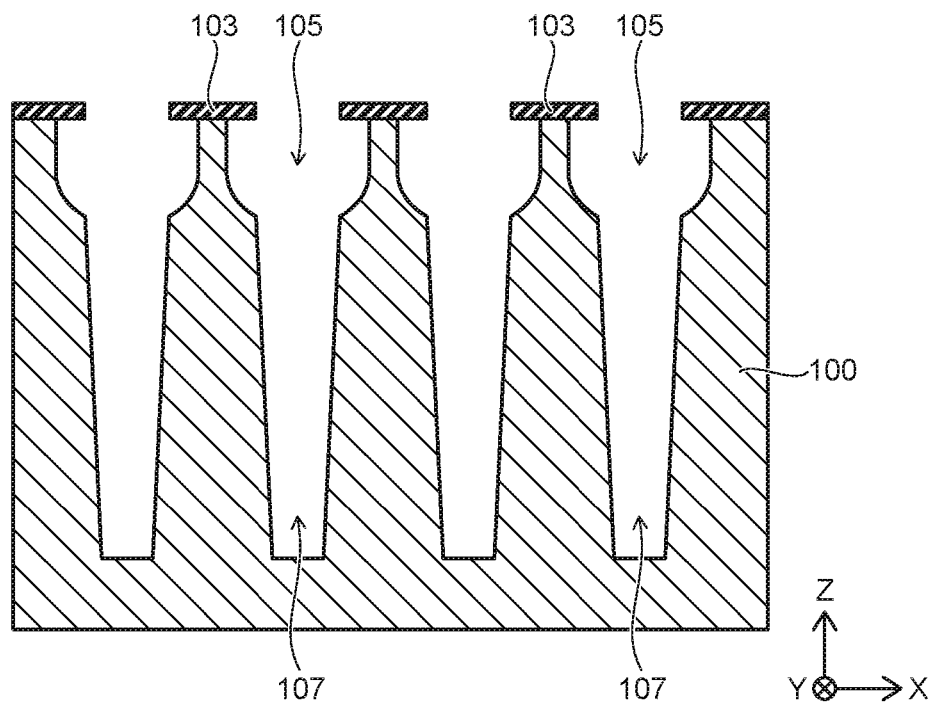

As shown in FIG. 3A, trenches 107 are formed in the front surface side of the semiconductor wafer 100 by selectively etching the semiconductor wafer 100 using the mask 103. For example, the trenches 107 are formed using anisotropic RIE (Reactive Ion Etching).

A trench 107 includes the opening portion 105 enlarged in the X-direction. The opening portion 105 is provided to make it easy to grow a p-type semiconductor layer inside the trench 107. For example, it is possible to suppress the generation of defects, for example, cavities (voids) inside the p-type semiconductor layer by providing the opening portion 105.

Figure 3B:
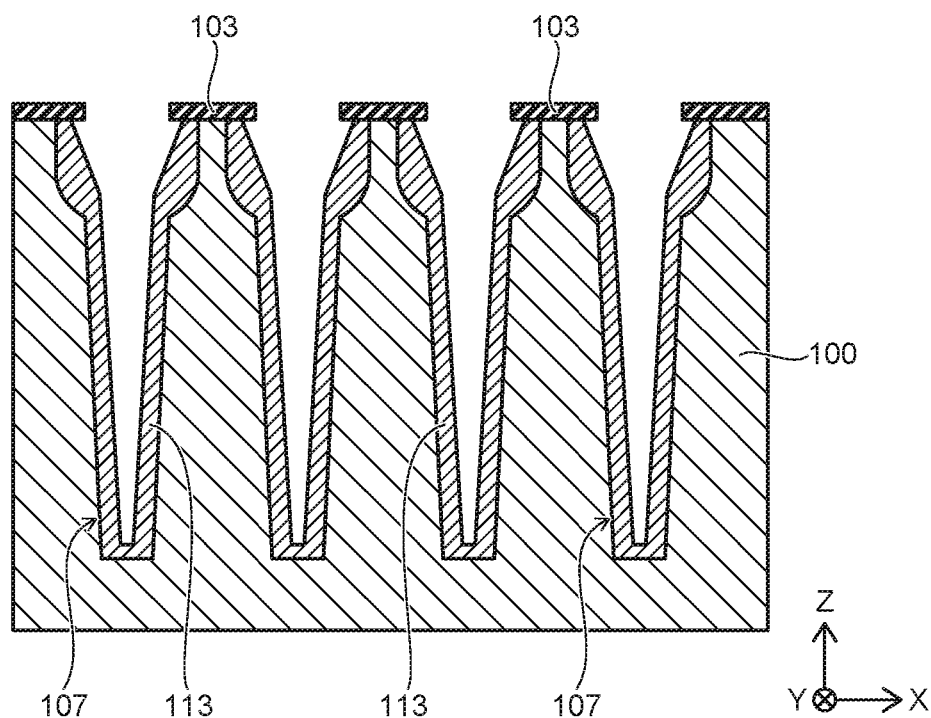

As shown in FIG. 3B, p-type semiconductor layers 113 are formed to cover the inner surfaces of the trenches 107. Because the mask 103 remains on the front surface of the semiconductor wafer 100, for example, a p-type semiconductor layer 113 is epitaxially grown selectively on the silicon surface that is exposed at the inner surface of the trench 107. The p-type semiconductor layer 113 is, for example, a p-type silicon layer including boron (B) which is a p-type impurity.

Figure 4A:
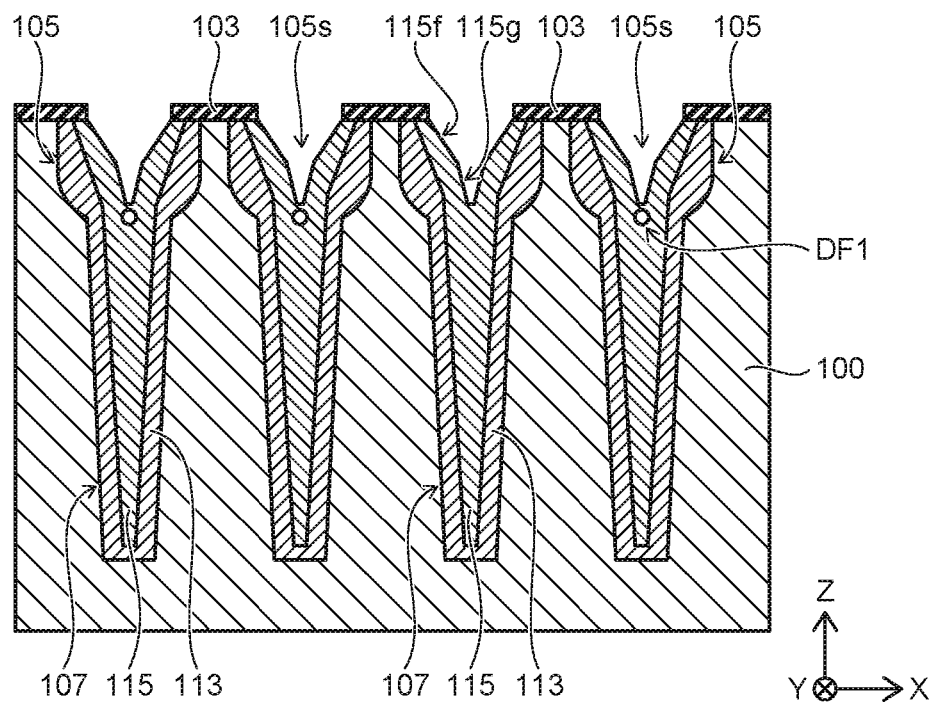

As shown in FIG. 4A, p-type semiconductor layers 115 are further formed inside the trenches 107. A p-type semiconductor layer 115 is epitaxially grown on the surface of the p-type semiconductor layer 113. The p-type semiconductor layer 115 is formed under a condition such that the growth rate thereof is slower than the growth rate of the p-type semiconductor layer 113. The p-type semiconductor layer 115 is, for example, a p-type silicon layer including boron (B) which is a p-type impurity.

For example, the growth of the p-type semiconductor layer 115 ends, leaving a space 105s inside the opening portion 105. For example, a first surface 115f and a second surface 115g of the p-type semiconductor layer 115 are exposed inside the space 105s. The first surface 115f is positioned in the Z-direction at a higher level than a level of the second surface 115g in the Z-direction. The first surface 115f is formed to be linked to the second surface 115g. The tilt angle of the first surface 115f with respect to the Z-direction is larger than the tilt angle of the second surface 115g with respect to the Z-direction.

For example, when the semiconductor wafer 100 is a silicon wafer having the (100) plane as a major surface, the first surface 115f is equivalent to the (111) plane. Such a shape of the space 105s is formed by epitaxial growth of silicon on the inner surface of the opening portion 105 while the mask 103 remains. There may be a case where a small void DF1 is formed directly under the space 105s in the Z-direction.

Figure 4B:
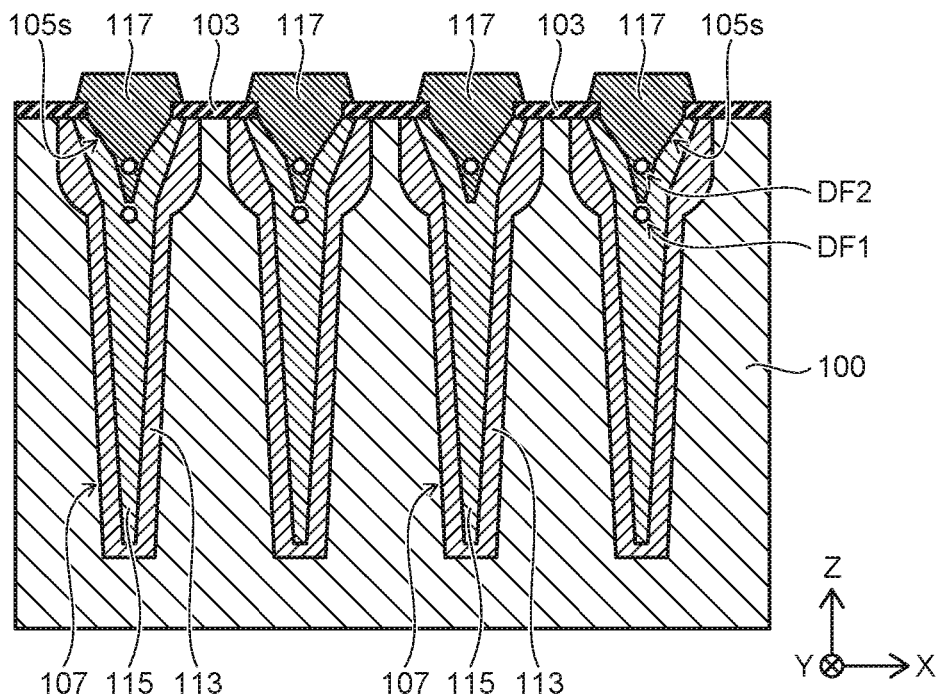

As shown in FIG. 4B, a p-type semiconductor layer 117 is formed to fill the space 105s. The p-type semiconductor layer 117 is epitaxially grown on the first surface 115f and the second surface 115g of the p-type semiconductor layer 115. The p-type semiconductor layer 117 is, for example, a p-type silicon layer including boron (B) which is a p-type impurity. The p-type semiconductor layer 117 is formed under a condition such that the growth rate thereof is faster than the growth rate of the p-type semiconductor layer 115. The p-type semiconductor layer 117 includes a void DF2 positioned in the Z-direction at the level of the connected portion of the first surface 115f and the second surface 115g.

Figure 5A:
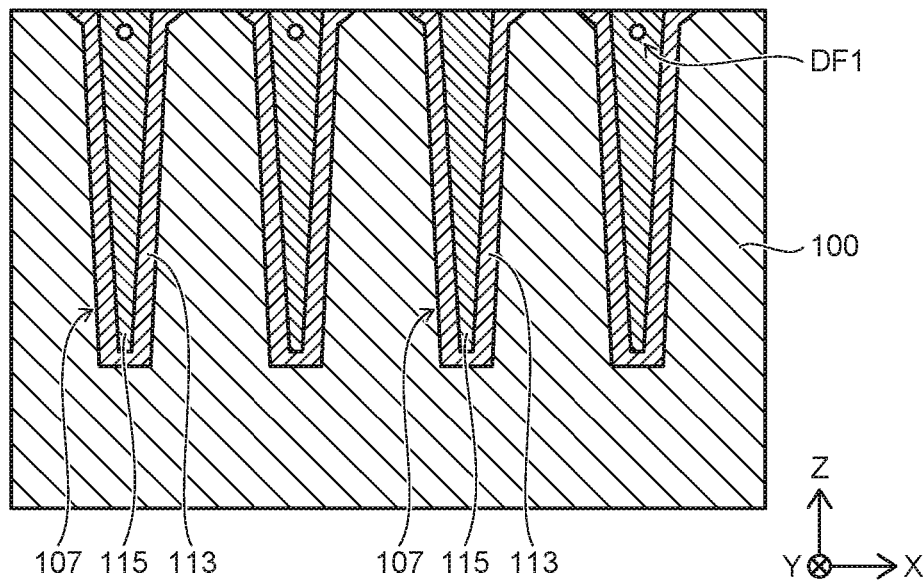

As shown in FIG. 5A, the surface portion of the semiconductor wafer 100 is removed on the front surface side thereof where the p-type semiconductor layer 117 is formed. For example, the surface layer of the semiconductor wafer 100 is removed using CMP (Chemical Mechanical Polishing). For example, the CMP is stopped at an intermediate level in the Z-direction between the void DF1 and the void DF2 (referring to FIG. 4B). The surface layer that includes the void DF2 is removed thereby. Also, it is possible to avoid the exposure of the void DF1 at the front surface of the semiconductor wafer 100.

Figure 5B:
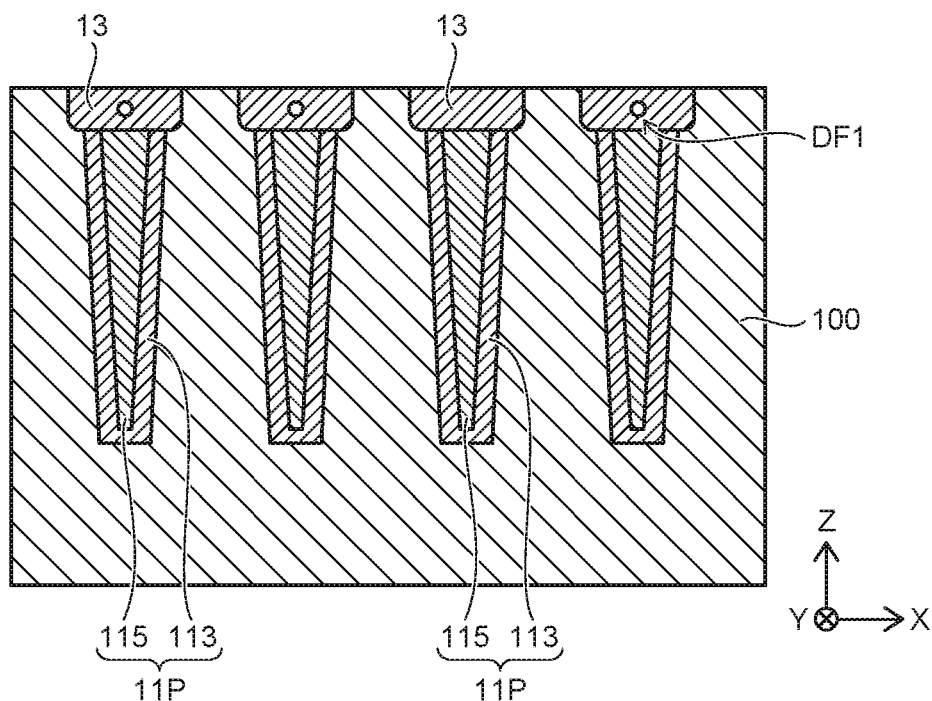

As shown in FIG. 5B, p-type diffusion layers 13 are formed selectively on the p-type pillars 11P, respectively. The p-type pillars 11P each include the p-type semiconductor layer 113 and the p-type semiconductor layer 115. For example, the p-type diffusion layers 13 are formed by selectively ion-implanting boron (B) which is a p-type impurity and is diffused by heat treatment. Then, a p-type diffusion layer 13 is formed so that the void DF1 is positioned therein. Thereby, it is possible to prevent the void DF1 from being positioned inside the depletion layer when operating the semiconductor device 1, and thus, it is possible to avoid the negative effects of the void DF1 on the device characteristics.

Figure 6A:
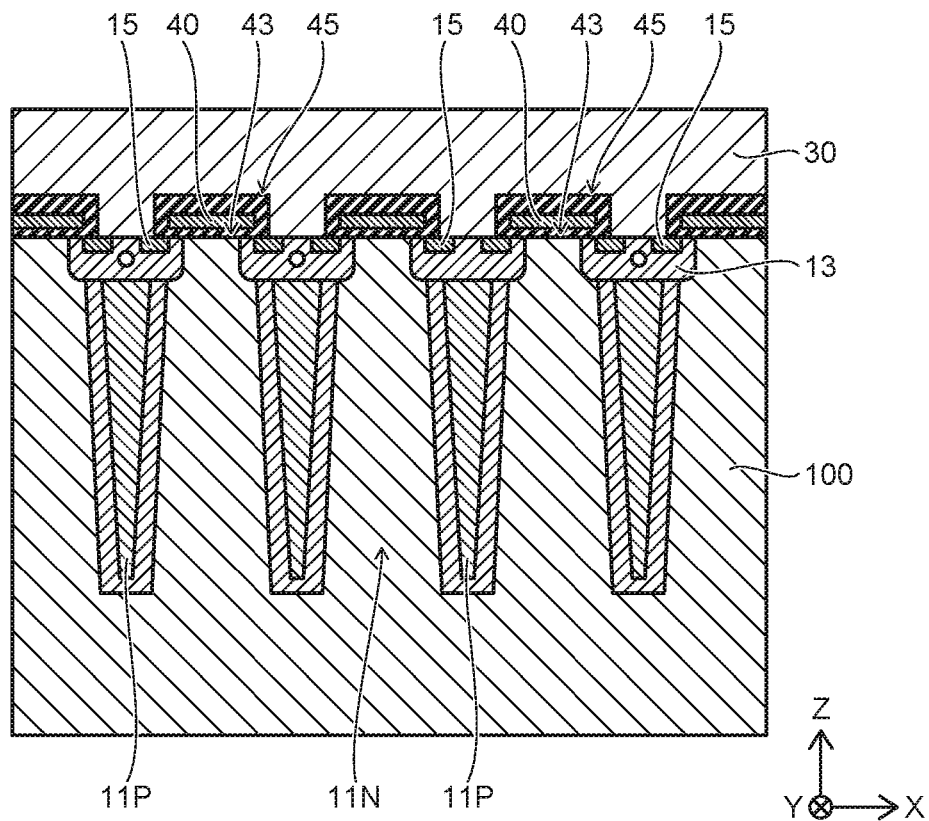

As shown in FIG. 6A, the n-type source layers 15 are formed selectively inside the p-type diffusion layer 13. For example, the n-type source layers 15 are formed by selectively ion-implanting phosphorus (P) which is an n-type impurity and is activated by heat treatment.

The gate electrodes 40 and the source electrode 30 also are formed on the front surface of the semiconductor wafer 100. Thereby, a MOS (Metal Oxide Semiconductor) structure is formed on the front surface side of the semiconductor wafer 100. Then, the semiconductor wafer 100 is thinned to a prescribed thickness by grinding or polishing on the backside thereof.

A p-type diffusion layer 13 is positioned between the p-type pillar 11P and the source electrode 30. An n-type source layer 15 is selectively provided between the p-type diffusion layer 13 and the source electrode 30. A gate electrode 40 is positioned between the source electrode 30 and a portion of the semiconductor wafer 100 (the n-type pillar 11N) that is positioned between the adjacent p-type pillars 11P. The source electrode 30 is provided to cover the p-type diffusion layer 13, the n-type source layer 15, and the gate electrode 40. The source electrode 30 is electrically connected to the n-type source layer 15 and the p-type diffusion layer 13 between the adjacent gate electrodes 40. The gate electrode 40 is electrically insulated from the n-type pillar 11N, the p-type diffusion layer 13, and the n-type source layer 15 by the gate insulating film 43. Also, the gate electrode 40 is electrically insulated from the source electrode 30 by the inter-layer insulating film 45.

Figure 6B:
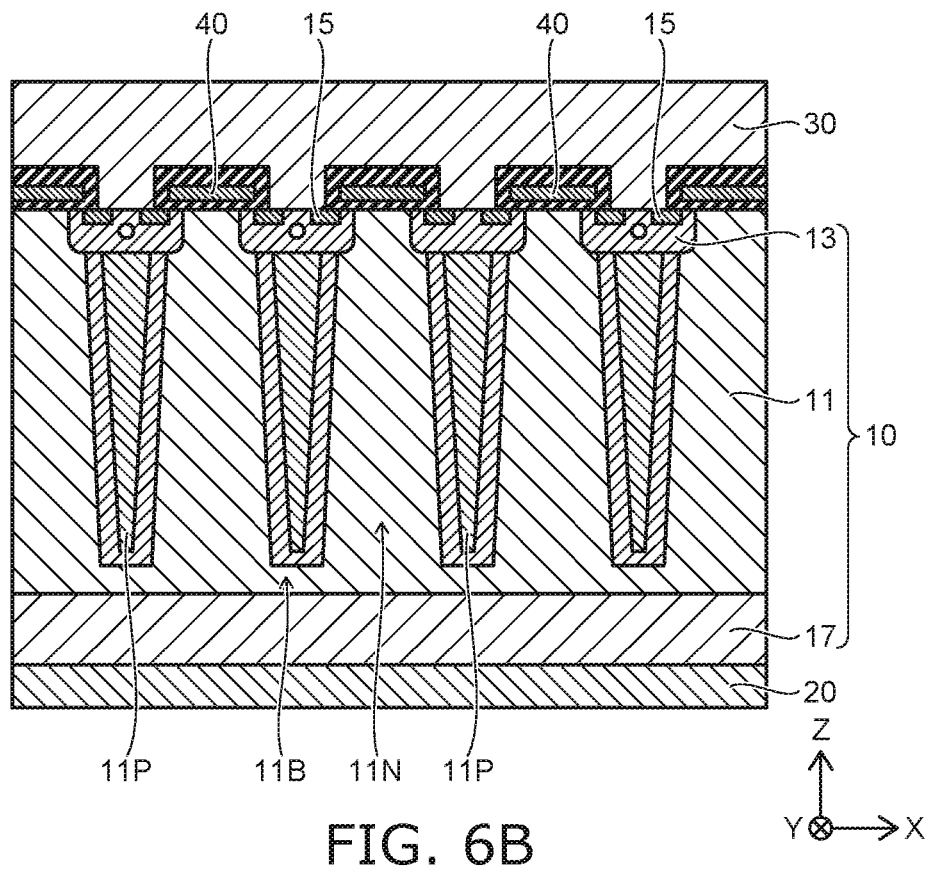

As shown in FIG. 6B, the semiconductor body 10 is completed by forming the n-type drain layer 17 at the backside of the semiconductor wafer 100. The drain electrode 20 also is formed on the back surface of the semiconductor body 10. A portion of the semiconductor wafer 100 remains as the n-type pillar 11N and the n-type semiconductor region 11B.

In the example recited above, although the processes of forming the p-type semiconductor layer 113, the p-type semiconductor layer 115, and the p-type semiconductor layer 117 inside the trench 107 are described in order, the p-type semiconductor layers may be formed to be continuous while changing the growth conditions.

Figure 7:
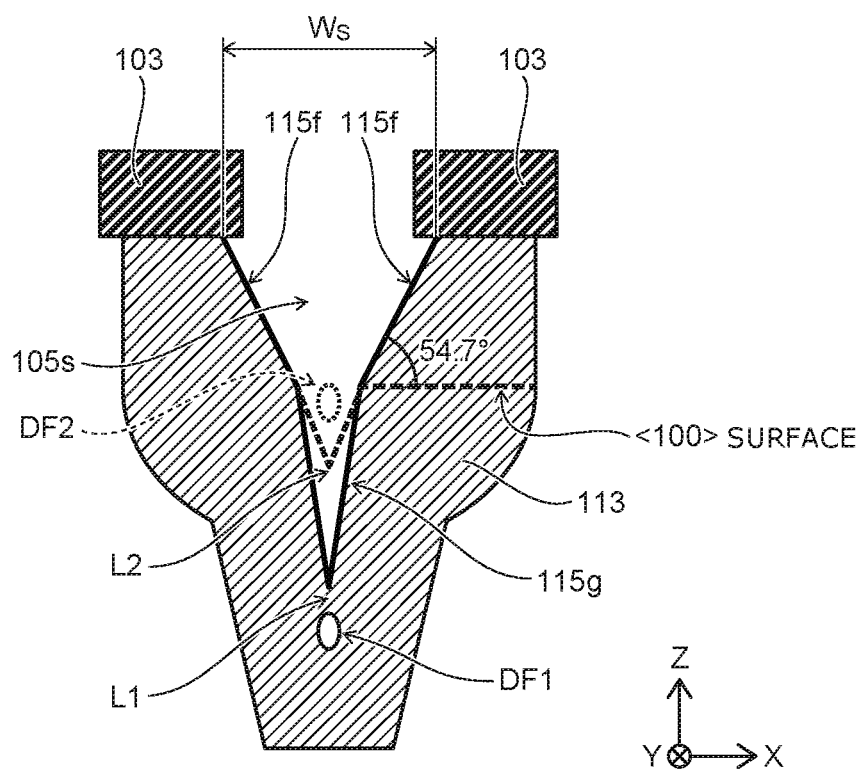
FIG. 7 is a schematic view showing a partial cross section of the semiconductor wafer in the manufacturing process of the semiconductor device according to the embodiment.

FIG. 7 is a schematic view showing a partial cross section of the semiconductor wafer 100 in a manufacturing process of the semiconductor device 1 according to the embodiment. FIG. 7 is a schematic cross-sectional view in which a portion of the cross section shown in FIG. 4A is enlarged.

For example, the structure shown in FIG. 7 is obtained by ending the epitaxial growth at the time when the p-type semiconductor layer 113 and the p-type semiconductor layer 115 are formed inside the trench 107.

As shown in FIG. 7, the space 105s is formed on the front surface side of the semiconductor wafer 100. For example, two first surfaces 115f and two second surfaces 115g are exposed at the inner surface of the space 105s.

For example, the void DF1 is formed directly under the bottom of the space 105s. In other words, the void DF1 is positioned lower than a level L1 in the Z-direction where the bottom of the space 105s is positioned. The void DF2 is formed at the level in the Z-direction where the first surface 115f is connected to the second surface 115g. For example, a level L2 where the extension planes of the two first surfaces 115f cross is positioned below the void DF2.

For example, the void DF2 can be removed by removing the surface layer of the semiconductor wafer 100 to an intermediate level between the level L1 and the level L2. Also, it is possible to prevent the void DF1 from being exposed at the front surface of the semiconductor wafer 100 after removing the surface layer thereof. Thus, the manufacturing yield of the semiconductor device 1 can be improved thereby.

For example, a monitor wafer is formed by stopping the growth of the p-type semiconductor layer that fills the trench 107 after the p-type semiconductor layer 115 is grown and before the growth of the p-type semiconductor layer 117 starts. The levels L1 and L2 can be estimated by the shape and size of the space 105s in the monitor wafer. For example, the level L1 of the bottom of the space 105s can be known by measuring the size of the space 105s in the monitor wafer. Also, the level L2 can be derived based on an opening width $W_S$ of the space 105s. In other words, when the first surface 115f is equivalent to the (111) plane of silicon, the level L2 is a depth calculated by $W_S \times (\frac{1}{2}) \times \text{Tan } 54.7°$. Here, "54.7°" is the interior angle between the (100) and (111) planes of silicon.

Thus, in the manufacturing processes of the semiconductor device 1 shown in FIG. 2A to FIG. 6B, the level L1 and the level L2 can be known by making the monitor wafer by stopping the growth of the p-type semiconductor layer after the p-type semiconductor layer 115 is grown and before the growth of the p-type semiconductor layer 117 starts. The removal amount of the surface layer of the semiconductor wafer 100 can be controlled thereby. A trench is formed in the monitor wafer and has substantially the same shape and size (e.g., the width in the X-direction and the depth in the Z-direction) as that of the wafer in which the p-type semiconductor layer 117 is formed.

Figure 8:
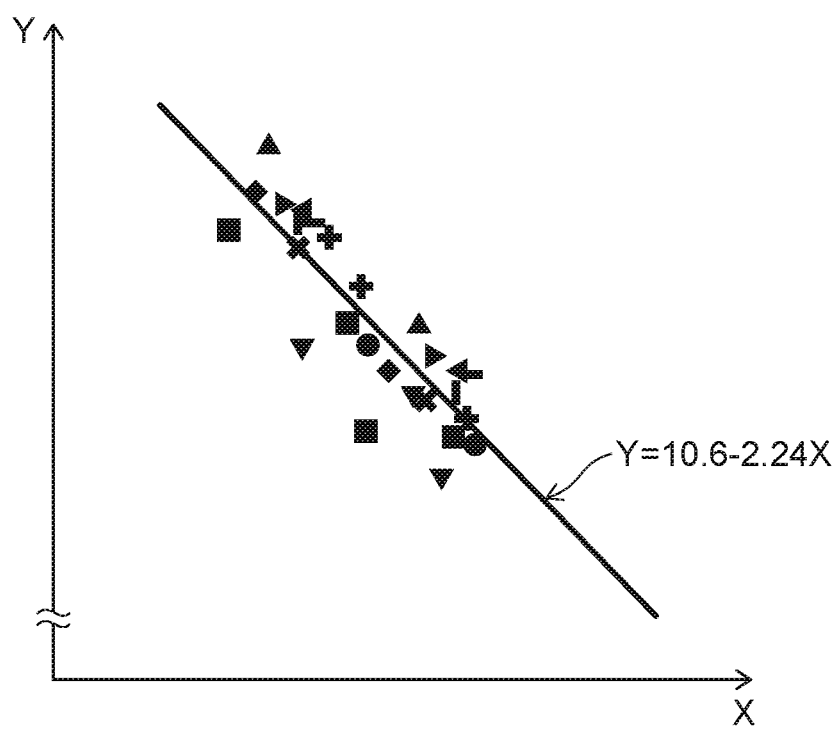
FIG. 8 is a graph showing a characteristic of the manufacturing processes of the semiconductor device according to the embodiment.

FIG. 8 is a graph showing a characteristic of the manufacturing processes of the semiconductor device 1 according to the embodiment. The horizontal axis X is the level in the Z-direction of the boundary between the first surface 115f and the second surface 115g. The vertical axis Y is the level in the Z-direction of the bottom of the space 105s. For example, X and Y are depths from the front surface of the semiconductor wafer 100.

Plotted in FIG. 8 is data which is obtained using the monitor wafer of which the growth process is stopped after the p-type semiconductor layer 115 is grown and before the growth of the p-type semiconductor layer 117 starts. The removal amount of the surface layer of the semiconductor wafer 100 may be controlled based on the correlation of these data. For example, the correlation equation $Y=10.6-2.24X$ is obtained from the data of FIG. 8. In other words, when one of X or Y can be known from the size and the shape of the space 105s, the intermediate level between the void DF1 and the void DF2, e.g., $(X+Y)/2$ can be known. The removal amount of the surface layer of the semiconductor wafer 100 may be controlled thereby.

Thus, in the embodiment, the opening portion 105 of the trench 107 is enlarged; and the growth rate of the p-type semiconductor layer 115 is set to be slower than the growth rate of the p-type semiconductor layer 113 and the growth rate of the p-type semiconductor layer 117. Thereby, it is possible to avoid the generation of large voids inside the p-type pillar 11P while suppressing the growth time of the super junction structure. Even using such a growth method, it is difficult to avoid the generation of the small void DF2, but possible to remove the void DF2 with the surface layer of the semiconductor wafer 100. Moreover, the exposure of the void DF1 can be avoided at the front surface of the semiconductor wafer 100. The manufacturing yield of the semiconductor device 1 can be increased thereby.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A method of manufacturing a semiconductor device, the method comprising:
preparing a first wafer of a first conductivity type, the first wafer including a first trench having a first opening portion, the first opening portion being enlarged comparing to other portion of the first trench;
forming a first semiconductor layer of a second conductivity type inside the first trench of the first wafer under a first growth condition so that a first space remains in the first opening portion of the first trench;
obtaining first and second levels along a depth direction of the first trench, the first level corresponding to a bottom of the first space, the second level being estimated by a size or a shape of the first space in the first trench;
preparing a second wafer of the first conductivity type, the second wafer including a second trench having a second opening portion, the second opening portion being enlarged comparing to other portion of the second trench, the second trench having a shape and a size substantially same as a shape and a size of the first trench;
forming a second semiconductor layer of the second conductivity type inside the second trench in the second wafer under the first growth condition so that a second space remains in the second opening portion of the second trench;
forming a third semiconductor layer under a second growth condition to fill the second space in the second trench; and
removing a surface portion of the second wafer to a depth corresponding to an intermediate level between the first level and the second level, the surface portion including a portion of the third semiconductor layer.

2. The method according to claim 1, wherein the first and second levels correspond to positions of defects generated in the first trench.

3. The method according to claim 1, wherein the first growth condition includes a first stage and a second stage, a semiconductor of the second conductivity type being grown at a first growth rate in the first stage, and being grown at a second growth rate slower than the first growth rate in the second stage.

4. The method according to claim 3, wherein a semiconductor of the second conductivity type is grown at a third growth rate faster than the second growth rate under the second growth condition.

5. The method according to claim 1, wherein
the first wafer has a front surface, the first trench being formed on the front surface side, and
the second level is a depth position spaced from the front surface of the first wafer with a distance estimated by multiplying tan 54.7° by ½ of an opening width of the first space.

6. The method according to claim 1, wherein
the first and second trenches are formed by selective etching using masks provided on the first wafer and the second wafer, respectively, and
the first semiconductor layer, the second semiconductor layer, and the third semiconductor layer are formed while the masks remain on the first wafer and the second wafer.

7. The method according to claim 1, wherein
the first space in the first trench has an inner surface including a first surface and a second surface, the first surface being formed with a first tilt angle with respect to the depth direction, the second surface being formed with a second tilt angle with respect to the depth direction, the second surface being positioned at a level along the depth direction lower than a level of the first surface along the depth direction, the first tile angle being larger than the second tilt angle.

8. The method according to claim 7, wherein the first surface is linked to the second surface.

9. The method according to claim 1, wherein
the first space in the first trench has an inner surface including a pair of first surfaces and a pair of second surfaces, the pair of second surfaces being positioned at a level along the depth direction lower than a level of the pair of first surfaces along the depth direction, the pair of first surfaces being linked to the pair of second surfaces, respectively, and the pair of second surfaces being linked to one another at a bottom of the first space.

10. The method according to claim 9, wherein
the pair of first surfaces is formed with a first tilt angle with respect to the depth direction,
the pair of second surfaces is formed with a second tilt angle with respect to the depth direction, the first tile angle being larger than the second tilt angle, and
extension planes of the pair of first surfaces cross at the second level.

11. The method according to claim 9, wherein the pair of first surfaces are equivalent to (111) plane.

12. The method according to claim 8, wherein the first and second levels are estimated by a correlation between a bottom level of the first space in the first trench and a level of a boundary between the first surface and the second surface.

13. The method according to claim 12, wherein
the first wafer has a front surface, the first trench being formed on the front surface side, and
the first and second levels are estimated by a correlation expressed by a formula of Y=10.6−2.24X, where X is a distance along the depth direction from the front surface to the bottom level of the first space, and Y is a distance along the depth direction from the front surface to a level of the connected portion of the first surface and the second surface.

* * * * *